(12) United States Patent
Luo

(10) Patent No.: US 10,672,700 B2
(45) Date of Patent: Jun. 2, 2020

(54) DISPLAY DEVICE AND CHIP-ON-FILM STRUCTURE THEREOF

(71) Applicant: Wuhan China Star Optoelectronics Semiconductor Display Technology Co., Ltd., Wuhan, Hubei (CN)

(72) Inventor: Jing Luo, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 15/765,188

(22) PCT Filed: Feb. 12, 2018

(86) PCT No.: PCT/CN2018/076481
§ 371 (c)(1),
(2) Date: Mar. 30, 2018

(87) PCT Pub. No.: WO2019/148549
PCT Pub. Date: Aug. 8, 2019

(65) Prior Publication Data
US 2019/0244881 A1 Aug. 8, 2019

(30) Foreign Application Priority Data
Feb. 2, 2018 (CN) .......................... 2018 1 0105842

(51) Int. Cl.
*H01L 23/498* (2006.01)
*H05K 3/36* (2006.01)
(Continued)

(52) U.S. Cl.
CPC ........ *H01L 23/4985* (2013.01); *H01L 23/145* (2013.01); *H01L 27/3276* (2013.01);
(Continued)

(58) Field of Classification Search
CPC ... H01L 23/4985; H01L 51/56; H01L 23/145; H01L 27/3276; H01L 23/49838;
(Continued)

(56) References Cited

U.S. PATENT DOCUMENTS

2018/0233436 A1* 8/2018 Lee ...................... G01R 31/024

FOREIGN PATENT DOCUMENTS

CN 104851369 A 8/2015
CN 105513498 A 4/2016
(Continued)

*Primary Examiner* — Benjamin T Liu
(74) *Attorney, Agent, or Firm* — Leong C. Lei

(57) ABSTRACT

A display device and a chip-on-film structure thereof are provided. The chip-on-film structure includes a substrate, multiple first output pads, multiple second output pads, multiple first lead wires, and multiple second lead wires. The substrate has a surface including a bonding zone. The first and output pads are located in the bonding zone. The first lead wires and the first output pads are located on the same surface of the substrate. The first lead wires and the second lead wires are located on two opposite surfaces of the substrate. Each of the first lead wires is connected to one of the first output pads. Each of the second lead wires is connected to one of the second output pads. The second lead wires each have a portion corresponding to the bonding zone and having the terminal sections that are respectively opposite to the first and second output pads.

7 Claims, 2 Drawing Sheets

(51) Int. Cl.
  *H01L 23/14*    (2006.01)
  *H01L 27/32*    (2006.01)
  *H05K 1/11*     (2006.01)
  *H05K 1/18*     (2006.01)
  *H05K 3/32*     (2006.01)
  *H01L 51/56*    (2006.01)

(52) U.S. Cl.
  CPC .............. *H01L 51/56* (2013.01); *H05K 3/323* (2013.01); *H05K 3/361* (2013.01); *H05K 1/118* (2013.01); *H05K 1/189* (2013.01); *H05K 2201/10128* (2013.01); *H05K 2203/1189* (2013.01)

(58) Field of Classification Search
  CPC ........ H05K 3/323; H05K 3/361; H05K 1/118; H05K 1/189; H05K 2201/10128; H05K 2203/1189
  See application file for complete search history.

(56) References Cited

FOREIGN PATENT DOCUMENTS

| | | |
|---|---|---|
| CN | 205541693 U | 8/2016 |
| KR | 10-2008-0077588 A | 8/2008 |

* cited by examiner

DISPLAY DEVICE AND CHIP-ON-FILM STRUCTURE THEREOF

RELATED APPLICATIONS

The present application is a National Phase of International Application Number PCT/CN2018/076481, filed Feb. 12, 2018, and claims the priority of China Application No. 201810105842.1, filed Feb. 2, 2018.

BACKGROUND OF THE INVENTION

1. Field of the Invention

The present invention relates to the field of display technology, and more particularly to a display device and a chip-on-film thereof.

2. The Related Arts

Flexible displays, which are display devices that are made of flexible materials and can be curved, possess various advantages, including reduced thickness, small size, being light weight, being easy to carry, saving energy and being environment friendly, and fashion. Thus, the flexible displays are becoming a main stream. Heretofore, designs of flexible displays generally adopt chip on film (COF) structure. COF is now a display technique of the flexible displays that offers great competition advantages. With the increasing of resolution of the flexible displays, COF is required to have an increased number of output pads so that the number of lead wires connected with the output pads is also increased. Due to the space of COF for laying wires being limited, the lead wires must be arranged on two opposite sides of a COF substrate. In bonding the COF, the arrangement of the lead wires may cause non-uniform of force application in a pressing operation of the output pads, leading to adverse issues of shallow conductive particles and bubbling in pressing.

SUMMARY OF THE INVENTION

To overcome the deficiencies of the prior art, the present invention provides a display device and a chip-on-film structure thereof, which help avoid adverse issues of shallow conductive particles and bubbling in pressing caused by non-uniform force application in a pressing process.

A technical solution proposed in the present invention is to provide a chip-on-film structure. The chip-on-film structure comprises a substrate, a plurality of first output pads, a plurality of second output pads, a plurality of first lead wires, and a plurality of second lead wires. The substrate has a surface that comprises a bonding zone. The plurality of first output pads and the plurality of second output pads are located in the bonding zone. The plurality of first lead wires and the plurality of first output pads are located on one common surface of the substrate. The plurality of first lead wires and the plurality of second lead wires are respectively located on two opposite surfaces of the substrate. Each of the first lead wires is connected to one of the first output pads. Each of the second lead wires is connected to the second output pads. The second lead wires each have a portion that corresponds to the bonding zone and has two terminal sections respectively opposite to the first output pads and the second output pads.

Optionally, the plurality of first output pads and the plurality of second output pads are arranged to stagger with respect to each other.

Optionally, the plurality of first output pads and the plurality of second output pads are respectively arranged in a straight line extending in a first direction, and the plurality of first output pads and the plurality of second output pads are spaced from each other in a second direction. The first direction and the second direction are perpendicular.

Optionally, the second lead wires have orthogonal projections on the substrate that cover orthogonal projections of the first lead wires on the substrate.

Optionally, the substrate is formed with vias that respectively correspond, in a one to one manner, to the plurality of second output pads, and the second lead wires are connected, through the vias, to the second output pads.

Optionally, the bonding zone is located between the vias and the first lead wires.

Optionally, the chip-on-film structure further comprises a driver chip. The driver chip is located on the same surface of the substrate as the plurality of first lead wires, and the first lead wires and the second lead wires are individually connected to the driver chip.

The present invention also provides a display device. The display device comprises a display panel and the above-described chip-on-film structure. The display panel comprises a plurality of first input pads that are respectively corresponding, in a one to one manner, to the plurality of first output pads and a plurality of second input pads that are respectively corresponding, in a one to one manner, to the plurality of second output pads. The plurality of first input pads are electrically connected to the plurality of first output pads. The plurality of second input pads are electrically connected to the plurality of second output pads.

Optionally, a conductive layer is further included, arranged between the first input pads and the first output pads and between the second input pads and the second output pads.

Optionally, the plurality of first input pads and the plurality of second input pads are located in an edge portion of the display panel.

The preset invention provides a chip-on-film structure that comprises a plurality of first output pads and a plurality of second output pads that are located in a bonding zone. A plurality of first lead wires and a plurality of second lead wires are respectively located on two opposite surfaces of the substrate. Orthogonal projections of the second lead wires on the substrate covers orthogonal projections of the first output pads and the second output pads on the substrate so that during a press to bond process, application of forces to the first and second output pads is made uniform and thus, adverse issues of shallow conductive particles and bubbling in pressing caused by non-uniform force application in the press to bond process can be avoided.

DETAILED DESCRIPTION OF THE PREFERRED EMBODIMENTS

Figure 1:
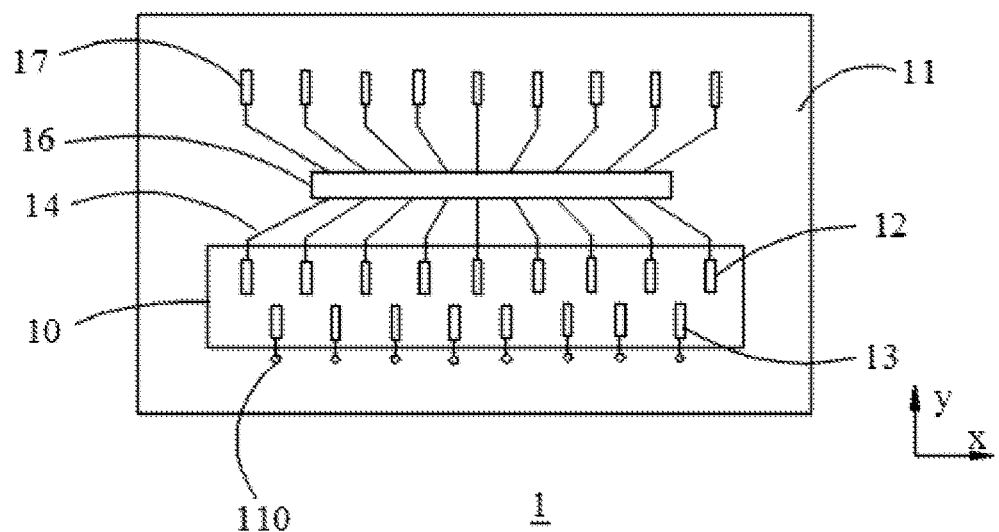
FIG. 1 is a front view of a chip-on-film structure.

Embodiments of the present invention will be described in detail below, with reference to the attached drawings. However, the present invention can be embodied in various forms and this invention should not be construed as being limited to the specific embodiments described herein. Oppositely, these embodiments are provided just for the purpose of explaining the principle of this invention and practical applications thereof, in order to allow skilled persons of this field to appreciate various embodiments of this invention and various modifications thereof that suit to specific predetermined applications. In the drawings, similar reference numerals are consistently used to designate the same elements.

Figure 2:
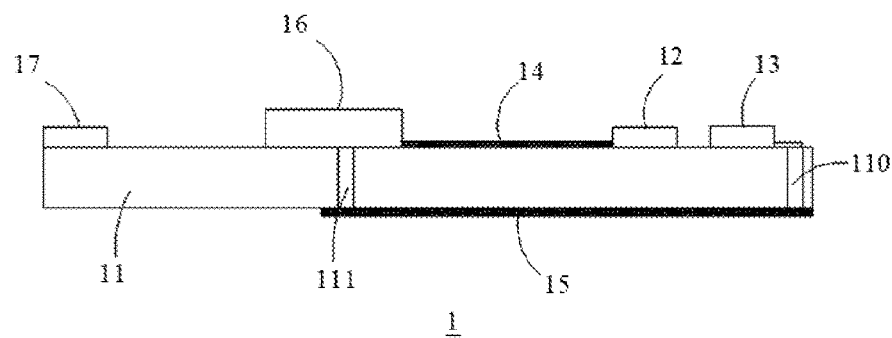
FIG. 2 is a cross-sectional view of the chip-on-film structure.
Figure 3:
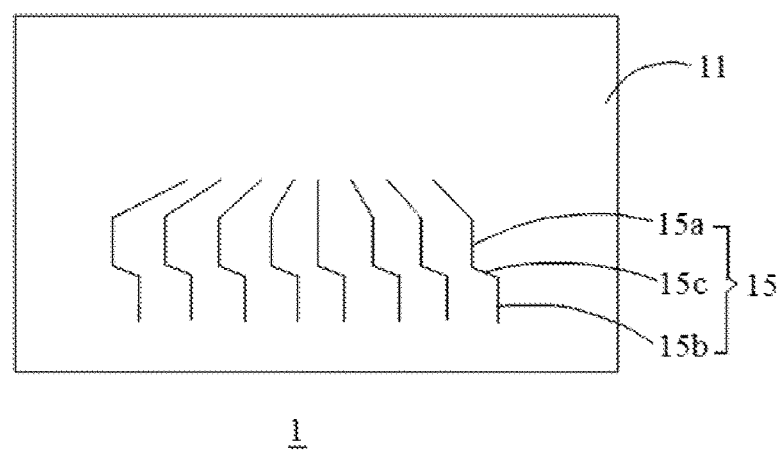
FIG. 3 is a rear view of the chip-on-film structure.

Referring to FIGS. 1, 2, and 3, the instant embodiment provides a chip-on-film structure 1, which comprises a substrate 11, a plurality of first output pads 12, a plurality of second output pads 13, a plurality of first lead wires 14, and a plurality of second lead wires 15. The substrate 11 has a surface that comprises a bonding zone 10. The plurality of first output pads 12 and the plurality of second output pads 13 are located in the bonding zone 10. The plurality of first lead wires 14 are located on the same surface of the substrate 11 as the plurality of first output pads 12. The plurality of first lead wires 14 and the plurality of second lead wires 15 are respectively located on two opposite surfaces of the substrate 11. Each of the first lead wires 14 is individually connected to one of the first output pads 12. Each of the second lead wires 15 is connected to one of the second output pads 13. The second lead wires 15 each have a portion that corresponds to the bonding zone 10 and has two terminal sections that are respectively opposite to the first output pads 12 and the second output pads 13.

As shown in FIG. 3, the portions of the second lead wires 15 that correspond to the bonding zone 10 each comprises two terminal sections, which are a first terminal section 15a and a second terminal sections 15b, and a connection sections 15c. The first terminal sections 15a are exactly opposite to the first output pads 12, and the second terminal sections 15b are exactly opposite to the second output pads 13. In other words, the first terminal sections 15a have central axes that are respectively coincident with orthogonal projections of central axes of the first output pads 12 on the substrate 11, and the second terminal sections 15b have central axes that are respectively coincident with orthogonal projections of central axes of the second output pads 13 on the substrate 11. The connection sections 15c are respectively connected between the first terminal sections 15a and the second terminal sections 15b.

Specifically, the plurality of first output pads 12 and the plurality of second output pads 13 are arranged to stagger with respect to each other. In other words, each of the second output pads 13 is arranged between two adjacent ones of the first output pads 12. The plurality of first output pads 12 and the plurality of second output pads 13 are respectively arranged in a straight line extending in a first direction. The plurality of first output pads 12 and the plurality of second output pads 13 are spaced from each other in a second direction, wherein the first direction and the second direction are perpendicular. The first direction can be the x-direction shown in FIG. 1, while the second direction is the y-direction of FIG. 1.

The chip-on-film structure 1 according to the instant embodiment comprises a double-row structure in the y-direction, wherein a first row of the output pads in the y-direction comprises the second output pads 13 and a second row of the output pads in the y-direction comprises the first output pads 12. The first output pads 12 and the second output pads 13 are each of a shape that comprises an elongate configuration and perpendicular to the x-direction. This helps reduce a length of the chip-on-film structure 1 in the x-direction.

To make wire laying neat on the entire the chip-on-film structure, the second lead wires 15 are arranged to have orthogonal projections thereof on the substrate 11 cover orthogonal projections of the first lead wires 14 on the substrate 11. In other words, the first lead wires 14 and the second lead wires 15 are exactly opposite to each other.

The substrate 11 is formed with vias 110 that respectively correspond, in a one to one manner, to the plurality of second output pads 13. The second lead wires 15 are connected, through the vias 110, to the second output pads 13, wherein the second lead wires 15 extend through the vias 110 and are electrically connected, via wires, to the second output pads 13. Preferably, the bonding zone 10 is located between the vias 110 and the first lead wires 14, meaning the vias 110 are not located in the bonding zone 10. This helps prevent bad contact between the second lead wires 15 and the second output pads 13 caused by forces applied to connection sites between the second lead wires 15 and conductors in the vias 110 during a press-to-bond process.

In the instant embodiment, the chip-on-film structure 1 further comprises a driver chip 16. The driver chip 16 is located on the same surface of the substrate 11 as the plurality of first lead wires 14. The first lead wires 14 and the second lead wires 15 are individually connected to the driver chip 16. In other words, the first output pads 12 are connected through the first lead wires 14 to the driver chip 16, and the second output pads 13 are connected through the second lead wires 15 to the driver chip 16, wherein the second lead wires 15 are connected, through the vias 111, to the driver chip 16.

Further, the chip-on-film structure 1 of the instant embodiment further comprises third input pads 17. The third input pads 17 and the bonding zone 10 are respectively set at two opposite ends portions of the substrate 11 and the driver chip 16 is located between the third input pads 17 and the bonding zone 10. The third input pads 17 are connected through wires to the driver chip 16. The chip-on-film structure 1 is connected through the third input pads 17 to a drive circuit (not shown) and receives a drive signal from the drive circuit.

Figure 4:
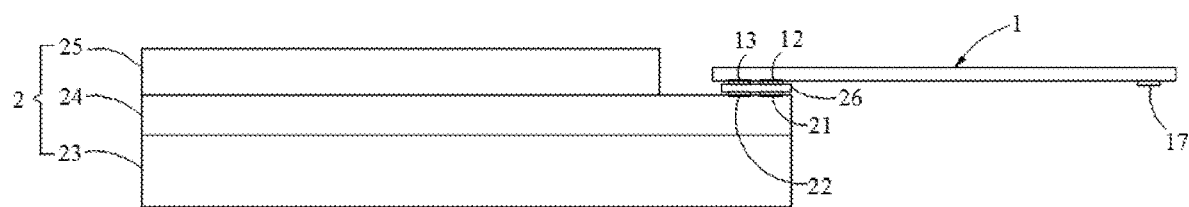
FIG. 4 is a schematic view illustrating a structure of a display device.
Figure 5:
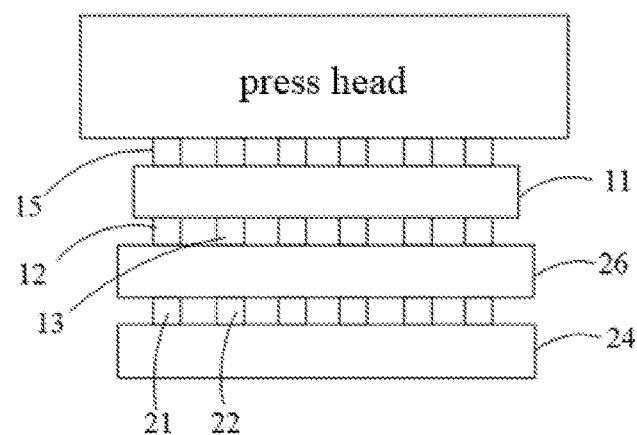
FIG. 5 is an enlarged view of a portion of FIG. 4.

Referring to FIGS. 4 and 5, the instant embodiment also provides a display device, which comprises a display panel 2 and the above-described chip-on-film structure 1. The display panel 2 is provided with a plurality of first input pads 21 that are respectively corresponding, in a one to one manner, to the plurality of first output pads 12 and a plurality of second input pads 22 that are respectively corresponding, in a one to one manner, to the plurality of second output pads 13. The plurality of first input pads 21 are electrically connected to the plurality of first output pads 12 and the a plurality of second input pads 22 are electrically connected to the plurality of second output pads 13. By means of the first output pads 12, the second output pads 13, the first lead wires 14, the second lead wires 15, the first input pads 21, and the second input pads 22, the driver chip 16 and the display panel 2 are electrically connected to thereby allow the drive signal of the drive circuit to transmit to the display panel 2.

In the instant embodiment, the display panel 2 comprises a base plate 23, an alignment film 24, and a display layer 25, wherein the display layer 25 comprises an organic light emitting display (OLED). Certainly, no specific limitation is imposed herein. The alignment film 24 is located between the base plate 23 and the display layer 25. The alignment film 24 and the base plate 23 have an edge portion that projects beyond the display layer 25. The projecting portion forms an edge frame zone of the display panel and the first input pads 21 and the second input pads 22 are arranged in the edge frame zone.

A conductive layer 26 is arranged between the bonding zone 10 and the edge frame one. The conductive layer 26 completely covers the first input pads 21 and the second input pads 22, and the first input pads 21 and the second input pads 22 are electrically connected, through the conductive layer 26, to the first output pads 12 and the second output pads 13.

Referring to FIG. 5, in a press-to-bond process, a press head acts on the second lead wires 15 to press and bond the first output pads 12 and the second output pads 13 with the first input pads 21 and the second input pads 22. The terminal sections of the portions of the second lead wires 15 that correspond to the bonding zone 10 are respectively and exactly opposite to the first output pads 12 and the second output pads 13. In other words, the first terminal sections 15a are exactly opposite to the first output pads 12 and the second terminal sections 15b are exactly opposite to the second output pads 13, meaning the central axes of the first terminal sections 15a and the central axes of the first output pads 12 have orthogonal projections on the substrate 11 that are coincident with each other; and the central axes of the second terminal sections 15b and the central axes of the second output pads 13 have orthogonal projections on the substrate 11 that are coincident with each other. During the process of press to bond, this arrangement allows for uniform force application between the first and second output pads 12, 13 and the first and second input pads 21, 22. Thus, the adverse issues of shallow conductive particles and bubbling in pressing caused by non-uniform force application in the press to bond process can be avoided.

The above provides embodiments of the present invention. It is noted that for those having ordinary skills in the field, various improvements and modifications can be made without departing from the principle of the application and such improvements and modifications are considered falling in the protection scope of the application.

What is claimed is:

1. A chip-on-film structure, comprising a substrate, a plurality of first output pads, a plurality of second output pads, a plurality of first lead wires, and a plurality of second lead wires, the substrate having a surface that comprises a bonding zone, the plurality of first output pads and the plurality of second output pads being located in the bonding zone, the plurality of first lead wires and the plurality of first output pads being located on one common surface of the substrate, the plurality of first lead wires and the plurality of second lead wires being respectively located on two opposite surfaces of the substrate, each of the first lead wires being connected to one of the first output pads, each of the second lead wires being connected to the second output pads, the second lead wires each having a portion that corresponds to the bonding zone and has two terminal sections respectively opposite to the first output pads and the second output pads, wherein the two terminal sections of each of the second lead wires extend in a predetermined direction and are shifted away from each other in a direction that is perpendicular to the predetermined direction to be respectively in alignment with the first and second output pads, the second lead wire having a connection section connected between the two terminal sections, such that the connection section is inclined with respect to the predetermined direction in which the two terminal sections extend.

2. The chip-on-film structure according to claim 1, wherein the plurality of first output pads and the plurality of second output pads are arranged to stagger with respect to each other, such that each of the plurality of second output pads is arranged between two adjacent ones of the plurality of first output pads.

3. The chip-on-film structure according to claim 2, wherein the plurality of first output pads and the plurality of second output pads are respectively arranged in a straight line extending in a first direction, and the plurality of first output pads and the plurality of second output pads are spaced from each other in a second direction, wherein the first direction and the second direction are perpendicular.

4. The chip-on-film structure according to claim 1, wherein the second lead wires have orthogonal projections on the substrate that cover orthogonal projections of the first lead wires on the substrate.

5. The chip-on-film structure according to claim 1, wherein the substrate is formed with vias that respectively correspond, in a one to one manner, to the plurality of second output pads, and the second lead wires are connected, through the vias, to the second output pads.

6. The chip-on-film structure according to claim 5, wherein the bonding zone is located between the vias and the first lead wires.

7. The chip-on-film structure according to claim 1 further comprising a driver chip, wherein the driver chip is located on the same surface of the substrate as the plurality of first lead wires, and the first lead wires and the second lead wires are individually connected to the driver chip.

* * * * *